US008629394B2

(12) United States Patent
Madokoro et al.

(10) Patent No.: US 8,629,394 B2
(45) Date of Patent: Jan. 14, 2014

(54) CHARGED PARTICLE BEAM DEVICE AND METHOD FOR CORRECTING POSITION WITH RESPECT TO CHARGED PARTICLE BEAM

(75) Inventors: Yuichi Madokoro, Hitachinaka (JP); Megumi Aizawa, Hitachi (JP); Yukio Yoshizawa, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 139 days.

(21) Appl. No.: 13/202,498

(22) PCT Filed: Oct. 23, 2009

(86) PCT No.: PCT/JP2009/005579
§ 371 (c)(1),
(2), (4) Date: Aug. 19, 2011

(87) PCT Pub. No.: WO2010/097860
PCT Pub. Date: Sep. 2, 2010

(65) Prior Publication Data
US 2011/0297826 A1    Dec. 8, 2011

(30) Foreign Application Priority Data

Feb. 27, 2009   (JP) ................................. 2009-045049

(51) Int. Cl.
*G01N 31/00*   (2006.01)
*G01N 33/00*   (2006.01)
(52) U.S. Cl.
USPC ....... 250/306; 250/310; 250/307; 250/492.21
(58) Field of Classification Search
USPC ........ 250/396 R, 442.11, 306, 310, 307, 309, 250/492.21, 311
See application file for complete search history.

(56) References Cited

U.S. PATENT DOCUMENTS 5,270,552 A     12/1993   Ohnishi et al.
6,320,195 B1 *  11/2001   Magome .................. 250/442.11
(Continued)

FOREIGN PATENT DOCUMENTS

DE    2542812 A1    4/1977
JP    62-184753 A1   8/1987
(Continued)

OTHER PUBLICATIONS

Extended European Search Report issued in Application No. 09840714.1 dated Jul. 5, 2013.

*Primary Examiner* — Nikita Wells
*Assistant Examiner* — Johnnie L Smith
(74) *Attorney, Agent, or Firm* — McDermott Will & Emery LLP

(57) ABSTRACT

An object of the present invention is to eliminate a distortion in an image even if there is an angular difference between the deflection direction of the charged particle beam and the tilt axis of a specimen, and to accurately observe and process the specimen. When the deflection direction of the charged particle beam is not parallel to the tilt axis of the specimen, the deflection rotation angle to the observation direction of the charged particle beam is determined, and the deflection pattern is changed. Thereby the distortion in the image is corrected. The deflection pattern is changed to a parallelogram. A distortion-free image is obtained even if the specimen is tilted, and the specimen can be observed and processed with high accuracy. This allows automatically recognizing the position correction mark to perform observation and processing after correcting the positional relation.

17 Claims, 11 Drawing Sheets

(56) References Cited

U.S. PATENT DOCUMENTS

| | | | |
|---|---|---|---|
| 6,664,552 B2* | 12/2003 | Shichi et al. | 250/492.21 |
| 7,268,356 B2* | 9/2007 | Shichi et al. | 250/492.21 |
| 7,482,586 B2* | 1/2009 | Ishitani et al. | 250/306 |
| 7,897,936 B2* | 3/2011 | Shichi et al. | 250/442.11 |
| 7,915,581 B2* | 3/2011 | Ishitani et al. | 250/307 |
| 2006/0043293 A1* | 3/2006 | Doi et al. | 250/310 |
| 2007/0023651 A1* | 2/2007 | Ishitani et al. | 250/309 |
| 2008/0054187 A1 | 3/2008 | Yamamoto et al. | |
| 2008/0191151 A1* | 8/2008 | Shichi et al. | 250/492.3 |
| 2009/0127458 A1* | 5/2009 | Ishitani et al. | 250/307 |
| 2009/0262321 A1* | 10/2009 | Makinouchi | 355/67 |

FOREIGN PATENT DOCUMENTS

| | | |
|---|---|---|
| JP | 4-132909 A1 | 5/1992 |
| JP | 5-190130 A | 7/1993 |
| JP | 2004-271270 A | 9/2004 |
| JP | 2006-086182 A | 3/2006 |
| JP | 2008-059916 A | 3/2008 |

* cited by examiner

DETECT MARK

CHARGED PARTICLE BEAM DEVICE AND METHOD FOR CORRECTING POSITION WITH RESPECT TO CHARGED PARTICLE BEAM

RELATED APPLICATIONS

This application is the U.S. National Phase under 35 U.S.C. §371 of International Application No. PCT/JP2009/005579, filed on Oct. 23, 2009, which in turn claims the benefit of Japanese Application No. 2009-045049, filed on Feb. 27, 2009, the disclosures of which Applications are incorporated by reference herein.

TECHNICAL FIELD

The present invention relates to deflecting and scanning a charged particle beam.

BACKGROUND ART

With regard to the application of a Scanning Electron Microscope (SEM) and a Focused Ion Beam (FIB) apparatus, etc. to semiconductor devices, it becomes more important to observe and process the three-dimensional structure or shape by observing a specimen from many directions. For example, when a SEM is used to observe a two-dimensional specimen such as a wafer conventionally from the direction vertical to the specimen surface while a need arises today to observe the cross-section structure of a device vertical to the specimen surface. In addition, when an FIB apparatus is used to separate a very small specimen from a specimen substrate or to fabricate a thin-film specimen of even film thickness, a tilted specimen is observed or processed.

JP-A-04-132909 (Patent Literature 1) discloses a technology in which the deflection pattern of an electron beam has a trapezoidal shape and a rectangular scan area is formed on a tilted specimen.

CITATION LIST

Patent Literature

Patent Literature 1: JP-A-04-132909

SUMMARY OF INVENTION

Technical Problem

The inventors of the present invention have conducted an intensive study on a distortion in an observed image at the time when a specimen surface is observed obliquely through charged particle beam scanning, and have found the following facts.

If the tilt axis of a specimen and the deflection direction of the charged particle beam are not parallel when the specimen is tilted for observation, then a distortion occurs in the image when the tilt angle of the specimen is changed. During FIB processing, this distortion generates a problem that the position correction mark on the specimen can be automatically recognized from an angle but cannot be recognized from another angle. The failure to recognize the position correction mark when a specimen is tilted prevents from automatically observing or processing the tilted specimen from various angles.

To solve this problem, the specimen stage is turned to mechanically adjust the tilt angle of the specimen to the deflection direction. This solution produces a distortion in the observed image only in the form of a compression in the tilt direction (direction vertical to the tilt axis) that can be easily corrected or recognized. However, the adjustment operation to turn the specimen stage is easy when there is one specimen, but is cumbersome when there are multiple specimens on the specimen stage. This is because, even if the desired position on the specimen is set in the neighborhood of the center of the image, a misalignment between the optical axis of the charged particle beam used for the observation, and the rotation axis of the specimen stage results in a misalignment of several micrometers when the stage angle is corrected, and this misalignment requires readjustment. In particular, when the diameter of the specimen stage is large, it is difficult to adjust the rotation angle of the specimen placed far from the rotation axis of the specimen stage and to satisfy the accuracy of the position on the image at the same time.

Further, in the FIB-SEM apparatus in which the FIB and the SEM are integrated, the incident direction of the charged particle beam onto a specimen differs between the FIB optical system and the SEM optical system. Therefore, when the FIB optical system and the SEM optical system try to automatically recognize the same position correction mark but their beam scan directions are not parallel, a distortion occurs in the image, sometimes with the result that the FIB optical system and the SEM optical system recognize different position correction marks or cannot automatically recognize the position correction mark. This problem may be solved by accurately adjusting the deflection direction to the direction of the tilted column, but the problem still exists when multiple specimens are processed in parallel.

It is an object of the present invention to eliminate a distortion in an image so that the specimen can be observed and processed accurately, even if there is an angular difference between the deflection direction of a charged particle beam and the tilt axis of a specimen.

Solution to Problem

In the present invention, the deflection rotation angle to the observation direction of the charged particle beam is obtained when the deflection direction of the charged particle beam is not parallel to the tilt axis of a specimen, and the deflection pattern of the charged particle beam is changed to correct a distortion in the image. For example, the deflection pattern of the charged particle beam is changed to a parallelogram.

In addition, when an image in an observation direction is distorted, the similar image processing is performed for the observed image to eliminate the distortion in the image.

Advantageous Effects of Invention

The present invention produces a distortion-free image even if a specimen is tilted, allowing the specimen to be observed and processed accurately. This also allows automatically recognizing the position correction mark to perform observation and processing after correcting the positional relation. Further, in an apparatus such as an FIB-SEM combining heterogeneous charged particle beam optical systems, an FIB processing position can be determined based on an SEM image or an FIB processing surface can be observed by the SEM.

DESCRIPTION OF EMBODIMENTS

Figure 1:
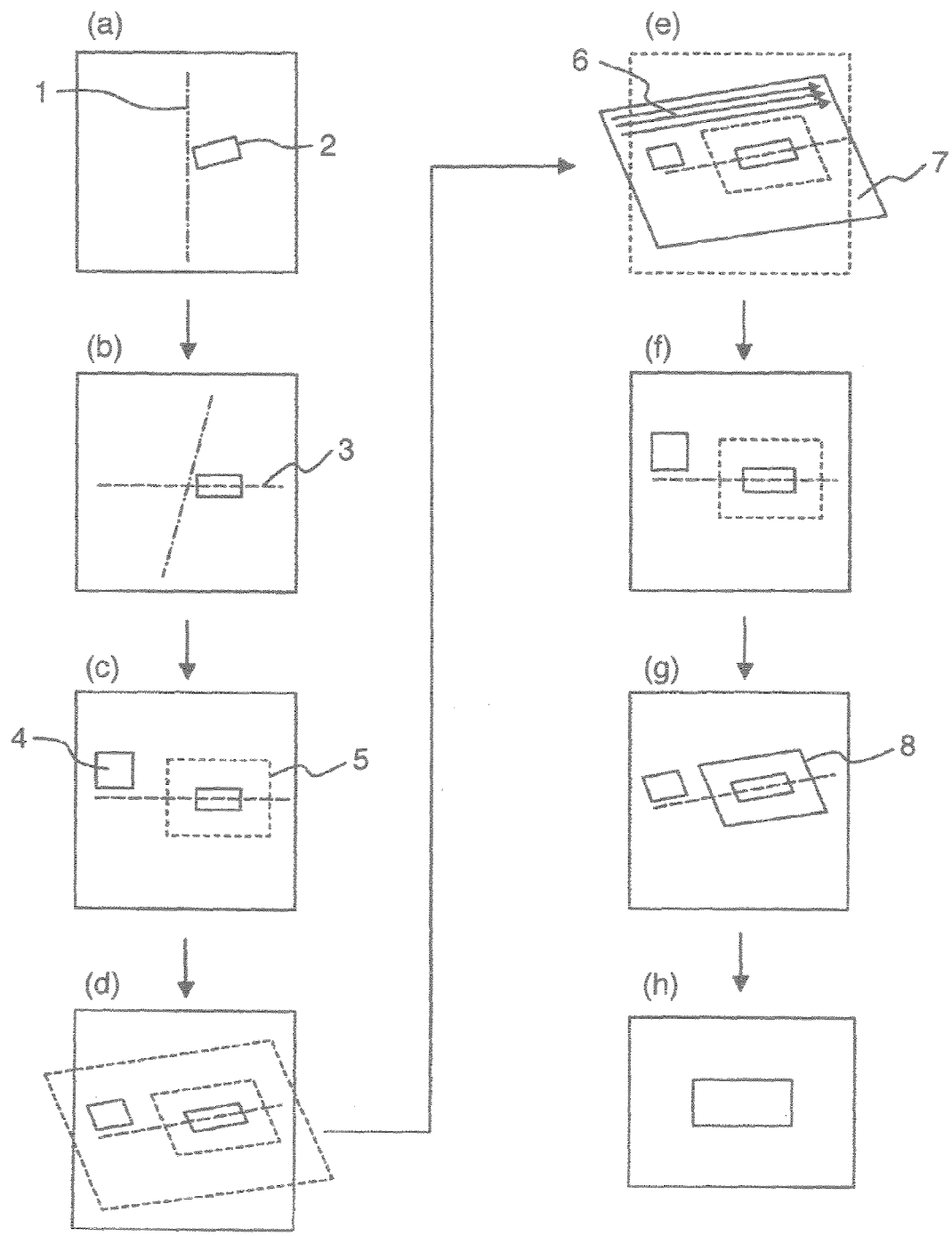
FIG. 1 shows the process in which the distortion-free image of a specimen surface is acquired.

In this embodiment, with changing the deflection pattern of the charged particle beam to a parallelogram, the three-dimensional shape of a tilted specimen is observed or a tilted specimen is processed when the deflection direction of the charged particle beam and the tilt axis are not parallel. This will be described below with reference to FIG. 1.

FIG. 1(a) shows the image of a specimen that is not tilted. A tilt direction 1 of the specimen (vertical to the tilt axis of the specimen) matches the top-down direction of the charged particle beam scan screen. The apparatus operator corrects the difference between the direction of the charged particle beam scan screen and a specific position 2 on the specimen to be observed by rotating the deflection direction (FIG. 1(b)). To observe the specimen through automatic position correction, the apparatus operator registers a position correction mark 4 which is a feature point on the specimen, as an image, and specifies an observation range 5 (FIG. 1(c)).

FIG. 1(d) shows an observed image by using the rectangular deflection pattern of the charged particle beam when the specimen is tilted. As shown in this figure, the observed image is distorted into a parallelogram. The shape of the distortion depends on the tilt angle of the specimen and the deflection rotation angle on the specimen surface. If the tilt direction is the top-down direction (Y direction) of the display image at the non-tilt time (FIG. 1(a)) and the deflection direction at the non-tilt time is rotated by an angle of −R to make it vertical to the tilt direction, then the shape at the time when the tilt angle is T is determined by the following transformation matrix.

(Expression 1)

$$\begin{pmatrix} x' \\ y' \end{pmatrix} = \begin{pmatrix} \sin^2 R(\cos T - 1) + 1 & \cos R \sin R(\cos T - 1) \\ \cos R \sin R(\cos T - 1) & \cos^2 R(\cos T - 1) + 1 \end{pmatrix} \begin{pmatrix} x \\ y \end{pmatrix}$$ [MATH. 1]

If the shape of the original observed object is a rectangle, the rectangle is changed to a parallelogram by this transformation. Only when R=0, the rectangle is reduced to cos T times the original size in only Y (tilt direction) as shown below.

(Expression 2)

$$\begin{pmatrix} x' \\ y' \end{pmatrix} = \begin{pmatrix} 1 & 0 \\ 0 & \cos T \end{pmatrix} \begin{pmatrix} x \\ y \end{pmatrix}$$ [MATH. 2]

Therefore, by changing the rectangular scan range to a parallelogram, the distortion is corrected and a distortion-free image can be obtained. By transforming the beam positions corresponding to the pixels of the original deflection pattern using the expression given above, a distortion-free image such as the one shown in FIG. 1(f) is obtained. If the mark is detected in this image, a distortion-free image (FIG. 1(h)) can be obtained by scanning a transformed shape 8 corresponding to the inside of the observation range 5 on the plane. Note that, though a distortion-free image can be obtained on the specimen surface, a large error is introduced when the specimen is tilted or not flat.

Conversely, if a distorted tilted-image is obtained, the expression given below, which is the inverse transformation expression of Expression 1, is used for image processing.

(Expression 3)

$$\begin{pmatrix} x \\ y \end{pmatrix} = \frac{1}{\cos T} \begin{pmatrix} \cos^2 R(\cos T - 1) + 1 & -\cos R \sin R(\cos T - 1) \\ -\cos R \sin R(\cos T - 1) & \sin^2 R(\cos T - 1) + 1 \end{pmatrix} \begin{pmatrix} x' \\ y' \end{pmatrix}$$ [MATH. 3]

This expression produces a distortion-free image. Expression 3 may be further transformed into the rotation matrix and an expansion transformation (1/cos T>0) of the Y direction as shown below.

(Expression 4)

$$\begin{pmatrix} x \\ y \end{pmatrix} = \begin{pmatrix} \cos(-R) & -\sin(-R) \\ \sin(-R) & \cos(-R) \end{pmatrix} \begin{pmatrix} 1 & 0 \\ 0 & 1/\cos T \end{pmatrix} \begin{pmatrix} \cos R & -\sin R \\ \sin R & \cos R \end{pmatrix} \begin{pmatrix} x' \\ y' \end{pmatrix}$$ [MATH. 4]

Therefore, even if the image processing given by Expression 3 cannot be performed directly, the equivalent image processing can be performed by the sequential transformation if there are image processing functions for rotation and expansion. If the deflection-direction rotation function of the apparatus is used, it is necessary to perform the rotation image processing only once, thereby reducing the calculation load.

The similar transformation can be performed easily for non-surface faces of the specimen using the tree-dimensional coordinates. The transformation for rotating the deflection direction by −R at the non-tilt time to make it vertical to the tilt direction is as follows.

(Expression 5)

$$\begin{pmatrix} x' \\ y' \\ z' \end{pmatrix} = \begin{pmatrix} \sin^2 R(\cos T - 1) + 1 & \cos R \sin R(\cos T - 1) & -\sin R \sin T \\ \cos R \sin R(\cos T - 1) & \cos^2 R(\cos T - 1) + 1 & -\cos R \sin T \\ \sin T \sin R & \sin T \cos R & \cos T \end{pmatrix} \begin{pmatrix} x \\ y \\ z \end{pmatrix}$$

[MATH. 5]

Because the cross section of the specimen is in the xz plane at the non-tilt time, the coordinates of the x'y' plane at the tilt time can be calculated by this transformation expression, and, as a result, the deflection range on the cross section, which is not seen at the non-tilt time, is given. Therefore, a portion in the yz plane corresponding to the side of a processed hole can be observed.

The inverse transformation corresponding to Expression 3 is given by the expression below and, therefore, the image transformation of a distorted cross section image can be performed as with a specimen surface.

(Expression 6)

$$\begin{pmatrix} x \\ y \\ z \end{pmatrix} = \begin{pmatrix} \sin^2 R(\cos T - 1) + 1 & \cos R \sin R(\cos T - 1) & \sin R \sin T \\ \cos R \sin R(\cos T - 1) & \cos^2 R(\cos T - 1) + 1 & \cos R \sin T \\ -\sin T \sin R & -\sin T \cos R & \cos T \end{pmatrix} \begin{pmatrix} x' \\ y' \\ z' \end{pmatrix}$$

[MATH. 6]

The three-dimensional transformation is exactly similar to the two-dimensional transformation in that the transformation is represented by a product of matrices and the transformations can be calculated in stages. The three-dimensional transformation expression is applicable also to a tilted plane. For example, even when the cross section of a specimen is not processed vertically, the image can be corrected if the angle is known. For a specimen that is not flat, this method is applicable by dividing the specimen into a part that is considered flat and a part that is not.

In an embodiment, a charged particle beam apparatus is disclosed that comprises: a deflector that deflects and scans a charged particle beam; a specimen stage that can be tilted; a display unit that detects secondary particles generated by irradiating a charged particle beam and displays an image; and an arithmetic unit that controls a deflection pattern of a charged particle beam wherein the deflection pattern of the charged particle beam can be changed from a rectangle to a parallelogram.

In another embodiment, a position correction processing method in a charged particle beam apparatus is disclosed that comprises the steps of: registering a first image of a position correction mark acquired by scanning a charged particle beam from a first observation direction, into an arithmetic unit; registering a second image of a position correction mark acquired by scanning the charged particle beam from a second observation direction, into the arithmetic unit; and comparing, by the arithmetic unit, the first image with an image obtained by sequentially performing first image processing, second image processing, and third image processing for the second image. The first image processing is rotation transformation by an angle between a perpendicular to a plane formed by the first and the second observation directions, and a deflection-and-scan direction of the charged particle beam. The second image processing is vertical-direction expansion transformation that is multiplied by the inverse of the cosine of an angle between the first and the second observation directions. The third image processing is rotation transformation in the direction inverse to the rotation transformation of the first image processing.

In another embodiment, it is disclosed that the scan direction of the charged particle beam is parallel to a side of the parallelogram. In another embodiment, it is disclosed that a shape of the parallelogram is changed according to a specimen-stage deflection rotation angle to an observation direction of the charged particle beam and a specimen-stage tilt angle.

In another embodiment, it is disclosed that, according to an angle between a first and a second observation directions of the charged particle beam and an angle between a perpendicular to the plane formed by the first and the second observation directions and a deflection-and-scan direction of the charged particle beam, a deflection pattern of the charged particle beam in a case where observation is made from the first observation direction is transformed to the deflection pattern of the charged particle beam in a case where observation is made from the second observation direction.

In another embodiment, it is disclosed that the image of a position correction mark acquired by scanning the charged particle beam in a rectangle from a first observation direction is registered in a control unit, and that the control unit detects the position correction mark from an image acquired by scanning the charged particle beam in a parallelogram from a second observation direction.

In another embodiment, it is disclosed that an image of a position correction mark acquired by scanning the charged particle beam in a rectangle from a first observation direction, and an image acquired by scanning the charged particle beam in a parallelogram from a second observation direction are superposed and displayed on the display unit.

In another embodiment, it is disclosed that the charged particle beam is an ion beam.

In another embodiment, it is disclosed that the charged particle beam is an electron beam.

In another embodiment, it is disclosed that the charged particle beam apparatus comprises: an ion beam column that irradiates an ion beam; and an electron beam column that irradiates an electron beam.

In another embodiment, it is disclosed that the charged particle beam apparatus can register a processing pattern for extracting a very small specimen from a specimen mounted on the specimen stage.

The following describes the above-described and other new features and effects of the present invention with reference to the drawings. The embodiments can be combined as necessary and this specification discloses the combined modes.

First Embodiment

This embodiment is an example in which cross-section processing or observation is performed automatically by a focused ion beam.

Figure 2:
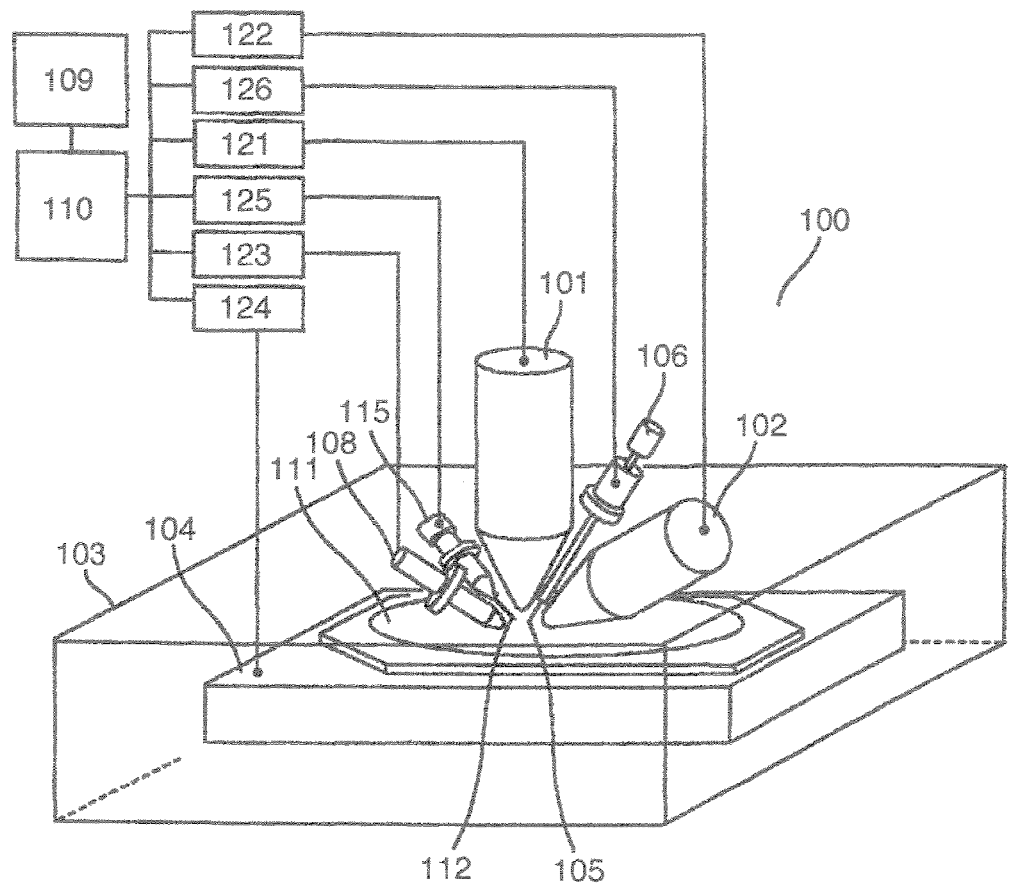
FIG. 2 is an outline of a charged particle beam apparatus.

FIG. 2 is an outline of a charged particle beam apparatus in this embodiment whose part is drawn in perspective.

A charged particle beam apparatus 100 comprises a focused ion beam column 101 that generates an ion beam for observing and processing a specimen or a probe, an electron beam column 102 that generates an electron beam for observing the shape of a specimen surface or a probe, a vacuum specimen chamber 103, a specimen stage 104 on which a specimen is placed, a probe driving unit 106 that finely moves a probe 105 in the vacuum specimen chamber 103, a detector 108, a deposit gas source 115, a display 109, and an arithmetic processing unit 110.

The focused ion beam column 101 forms ions generated by an ion source (not shown), into a beam that is irradiated on a specimen 111 or the probe 105 to allow the surface of the specimen 111 or the probe 105 to be observed or processed. The electron beam column 102 also forms electrons generated by an electron source (not shown), into a beam that is irradiated on the specimen 111 or the probe 105 to allow the surface of the specimen 111 or the probe 105 to be observed. By arranging both of the electron beam column 102 and the focused ion beam column 101 so that the irradiated position of the electron beam from the electron beam column 102 is approximately the same as the irradiated position of the ion beam from the focused ion beam column 101, a portion processed by the ion beam can be observed by the electron beam. In FIG. 1, the focused ion beam column 101 is arranged vertically while the electron beam column 102 is arranged at a slant with respect to the horizontal plane. However, the arrangement is not limited to this. For example, the electron beam column 102 may be arranged vertically while the focused ion beam column 101 may be arranged at a slant with respect to the horizontal plane.

The specimen 111 can be placed on the specimen stage 104, and the specimen stage 104 can move a portion to be processed or observed by the ion beam to the irradiated position of the ion beam, or to the electron beam observation position. Not only a semiconductor specimen but also steel, light metal, or polymer molecule, etc. is thought of as the specimen 111.

The probe 105 can be moved by the probe driving unit 106 in the vacuum specimen chamber 103, and is used to extract a fine specimen piece formed on a specimen or to touch the surface of a specimen to supply potential to the specimen. The deposit gas source 115 can store deposit gas which forms a deposit film by irradiating a charged particle beam, and supply the gas from a nozzle tip 112 as necessary.

The detector 108 is a detector of secondary electrons, secondary ions, back scattered electrons, X-rays, and reflected electrons that are generated from the irradiated portion on a specimen or a probe by irradiating an ion beam or an electron beam. The detected signals are calculated by the arithmetic processing unit 110 for generating images that are displayed on the display 109 as secondary electron images, secondary ion images, or a characteristic X-ray elemental map. Transmission electrons may also be detected by the detector 108 after the conversion to secondary electrons or a detector (not shown) for detecting transmission electrons. Further, the arithmetic processing unit 110 can control the focused ion beam column 101, electron beam column 102, detector 108, specimen stage 104, deposit gas source 115, and probe driving unit 106, respectively, via the ion beam control unit 121, electron beam control unit 122, detector control unit 123, stage control unit 124, deposit gas source control unit 125, and probe control unit 126.

The following describes the cross section observation performed for each of four analysis specimens in this embodiment.

Figure 3:
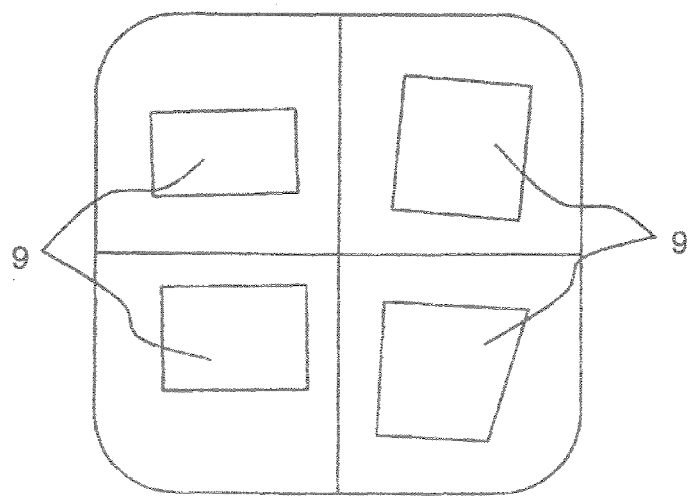
FIG. 3 is a diagram showing the state in which multiple specimens are fastened on the specimen stage.

FIG. 3 shows the state in which four analysis specimens 9 are fastened on the specimen stage. Each analysis specimen is fastened by an electrically conductive tape with a relative angular difference of 1°-5°. Electrical adjustment is made so that the initial deflection direction of the focused ion beam optical system is vertical to the tilt direction of the specimen stage with the error equal to or smaller than 0.1°.

Figure 4:
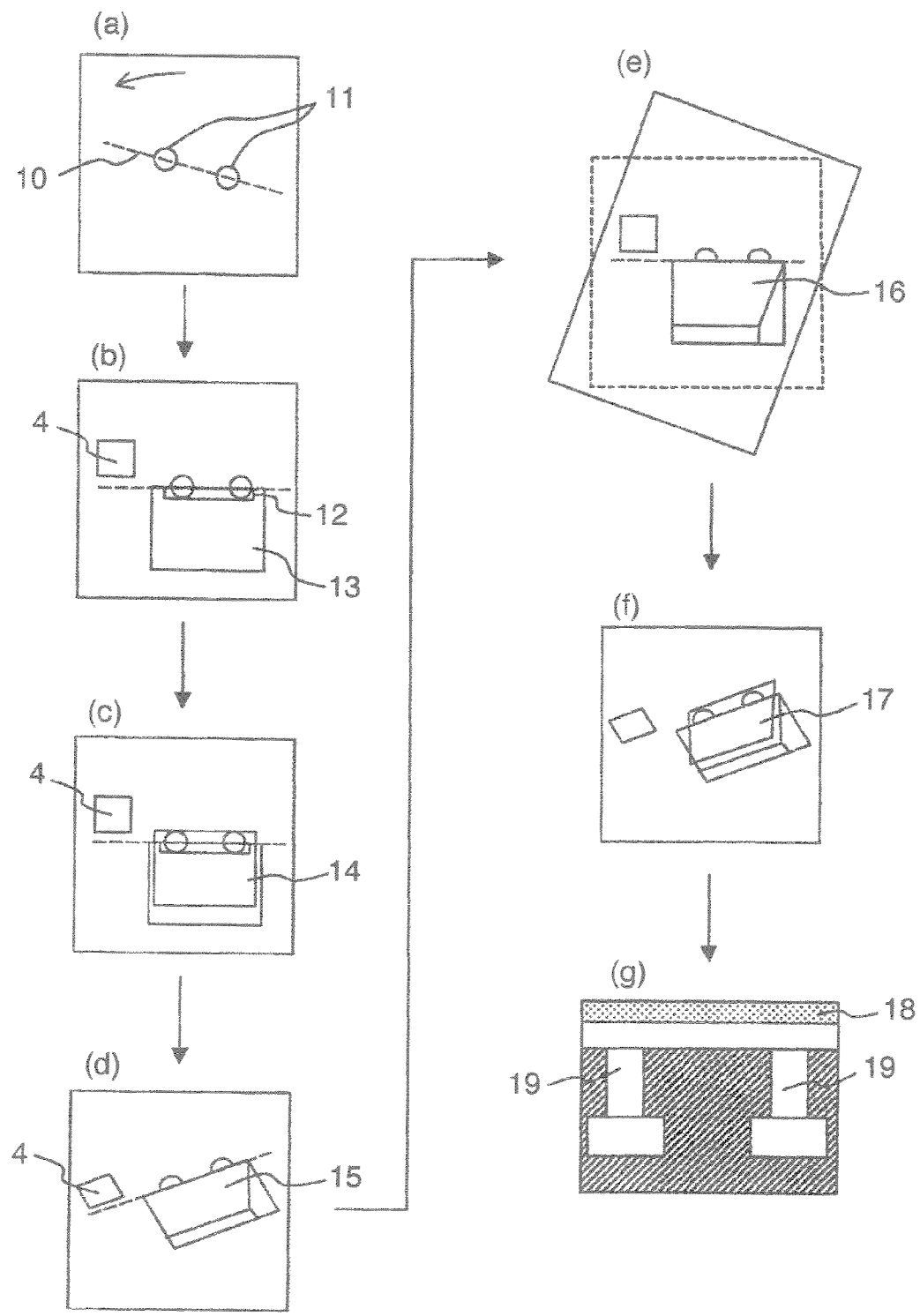
FIG. 4 is a diagram showing the process in which the cross section image of a specimen is automatically acquired.

FIG. 4(a) shows an image at the cross section observation point of the first analysis specimen. The analysis specimen is a semiconductor device which has two contact holes 11 on the wiring pattern. Assume that FIB processing is carried out on the plane which includes the centers of the two contact holes 11 to create a cross section indicated by a broken line 10.

The deflection direction is rotated about 5° while observing the specimen surface, and the portion in which the cross section is to be created (broken line 10) is adjusted horizontally with respect to the image (FIG. 4(b)). This adjustment may also be made by turning the specimen stage as with the conventional apparatus. In this case, however, there is a possibility that a misalignment between the rotation axis and the optical axis will generate an error of about several micrometers or that the stage movement between specimens via automatic processing will generate a registered-coordinates reproduction error.

Next, a cross-section finish processing pattern 12, a cross-section window processing pattern 13, and a cross-section observation pattern 14 are arranged on the operation screen (FIG. 4(c)).

The cross-section window processing pattern 13 is a pattern used for window processing by a large-current processing beam for high-speed processing. The cross-section finish processing pattern 12 is a finish processing pattern for finishing the cross section to an almost vertical-angle cross section. Here, because each pattern is a rectangular and the deflection direction of the charged particle beam is parallel to the side, the pattern can be specified by the representative point and the two vectors extending from the representative point, and so, the pattern can be set easily. Meanwhile, to set a general polygon pattern, the coordinates of the vertexes and the deflection direction are specified.

The cross-section observation pattern 14 is a pattern for specifying a cross-section processing observation range. It indicates an area in which the beam is to be irradiated after the specimen is tilted. In this apparatus, the end of the processing pattern 13 for vertically processing a specimen is arranged as the base point of the cross-section observation pattern 14.

Further, via GUI, it is entered that the cross-section observation pattern 14 is a cross-section pattern. When a tilt angle (45° in this embodiment) at the observation time is entered, this apparatus automatically selects a beam that gives a resolution for the observation. When a tilt angle at the processing time is entered, this apparatus automatically selects a beam for the processing. Considering that the brightness of an image will change when the specimen is tilted, this apparatus allows the operator to specify options for automatically adjusting the contrast and the brightness of the image. Although the eucentricity is adjusted in advance to prevent an image movement when the stage is tilted, the auto-focus may also be specified as necessary.

Although the cross-section observation pattern 14 is set in this apparatus with a specimen not tilted, it may also be set after forming the cross section and tilting the specimen for rough observation. In this apparatus, a rectangular cross-section observation pattern, one side of which is the broken line 10, is set with the specimen not tilted, and, by doing so, the cross section can be observed from the top edge of the cross section (from the surface of the specimen) after the specimen is tilted. However, the distance between the broken line 10 and the cross-section observation pattern 14 can be changed to change the position of the cross-section observation. That is, a cross-section observation pattern can be formed, for example, below the cross-section observation pattern drawn in FIG. 4(c) to observe the cross-section of a lower layer of the specimen not including the top surface.

In addition to the processing or observation patterns described above, the position correction mark 4 for position correction is processed and then the image is registered. Then, the registration ends for the automatic cross-section observation of the first analysis specimen.

For the second to fourth analysis specimens, the deflection direction is adjusted, the processing and observation pattern is set, the position correction mark is created, and the image is registered, as with the first analysis specimen. After all four analysis specimens are registered, the automatic processing/observation starts.

First, this apparatus moves to the registered coordinates of the first analysis specimen and detects the position correction mark 4. After that, the apparatus performs the window processing and the cross-section finish processing sequentially and tilts the specimen stage (FIG. 4(d)).

Then, the apparatus changes the deflection pattern of the focused ion beam to a parallelogram based on Expression 5 and scans the focused ion beam. This scan produces a distortion-free image (FIG. 4(e)).

From this distortion-free image, the apparatus automatically recognizes the position correction mark 4 again. Using the automatically recognized position correction mark 4 and the registered cross-section observation pattern 14, the arithmetic processing unit calculates the deflection pattern of the focused ion beam. This causes the focused ion beam to be scanned in the cross section of the parallelogram so that the focused ion beam becomes parallel to the side (FIG. 4(f)). As a result, a distortion-free cross section image (FIG. 4(g)) is acquired.

The apparatus performs the same processing and observation operation for the second to fourth analysis specimens as that for the first analysis specimen, and performs the cross-section processing and observation accurately for multiple specimens even if there are variations in the angle of actual specimens.

In this embodiment, by adjusting the deflection direction of the beam to a first observation direction for the specimen, the deflection pattern of the charged particle beam is transformed according to the expressions given above (Expressions 1 and 5), and, as a result, this transformation can correct a distortion that will occur in a second observation direction. The change of the deflection pattern can produce a distortion-free correct image. In addition, the apparatus can automatically recognize a tilted position correction mark accurately to perform observation and processing after correcting the positional relation. Because this embodiment uses the change of the deflection pattern but not the image processing with an error of the interpolation calculation, the recognition rate of a mark image is high.

Second Embodiment

This embodiment, does not process an observed image, but processes a registered mark image to automatically recognize the position correction mark from a tilted image. The following describes this embodiment with emphasis on the differences from the first embodiment.

As shown in FIGS. 5(a) and 5(b), this embodiment rotates the deflection direction to arrange the cross-section processing pattern 13, finish processing pattern 12, and cross-section observation pattern 14, processes the position correction mark 4, and, after that, registers the mark image, as with the first embodiment. Then, the apparatus automatically performs the cross-section window processing and the cross-section finish processing.

Figure 5:
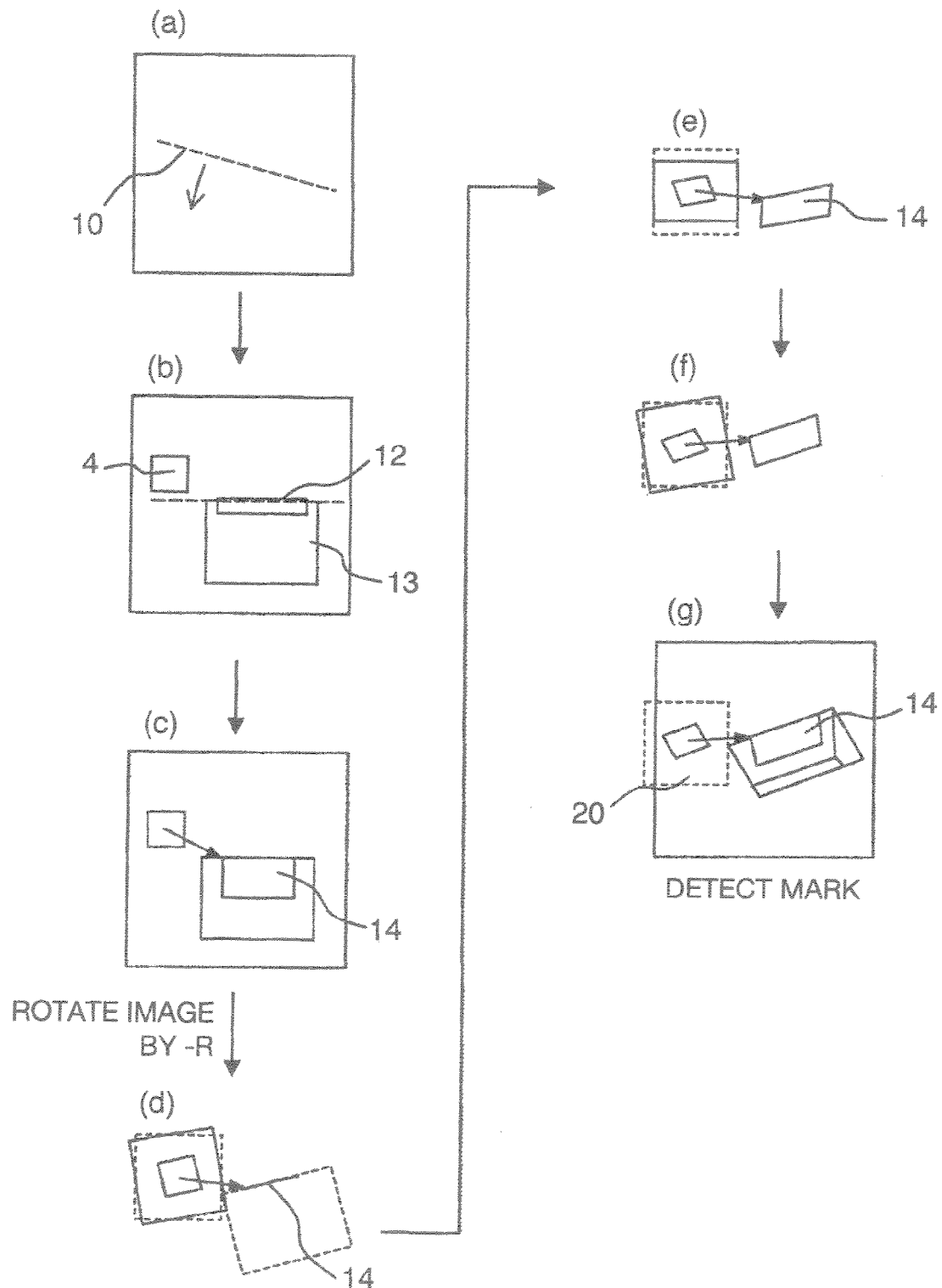
FIG. 5 is a diagram showing the process in which the cross section image of a specimen is automatically acquired.

After that, before capturing the tilted image of the specimen, the same transformation as that indicated by Expression 5 is performed in the control PC for the mark image. Because the control PC of the apparatus does not have the dedicated transformation software, it performs the image processing such as the rotation (FIG. 5(d)), compression (FIG. 5(e)), and rotation (FIG. 5(f)) for the mark image, instead of the transformation software. In this case, the same transformation is performed for a relative position vector 20 corresponding to the position correction mark 4 of the cross-section observation pattern 14 defined in the plane, to calculate the relative position for the position correction mark on the distorted image. Although only the relative position vector 20 for the representative vertex is shown in FIG. 5, the vectors in the directions of the two sides from this vertex are also transformed in practice. From the tilted image (FIG. 5(g)), the mark image for which the image processing was performed is detected using the same algorithm as that for a usual plane. The cross-section observation pattern 14 is arranged based on the transformed relative position vector, and the focused ion beam is deflected for cross-section observation.

Although the image processing is required in this embodiment, only the processing for the image data near the position correction mark and the position data on the processing pattern are required, providing the advantage that the apparatus load is reduced.

Third Embodiment

This embodiment performs the focused ion beam processing with multiple analysis specimens tilted, and extracts a very small specimen from each analysis specimen. The following describes the embodiment with emphasis on the differences from the first and second embodiments.

Figure 6:
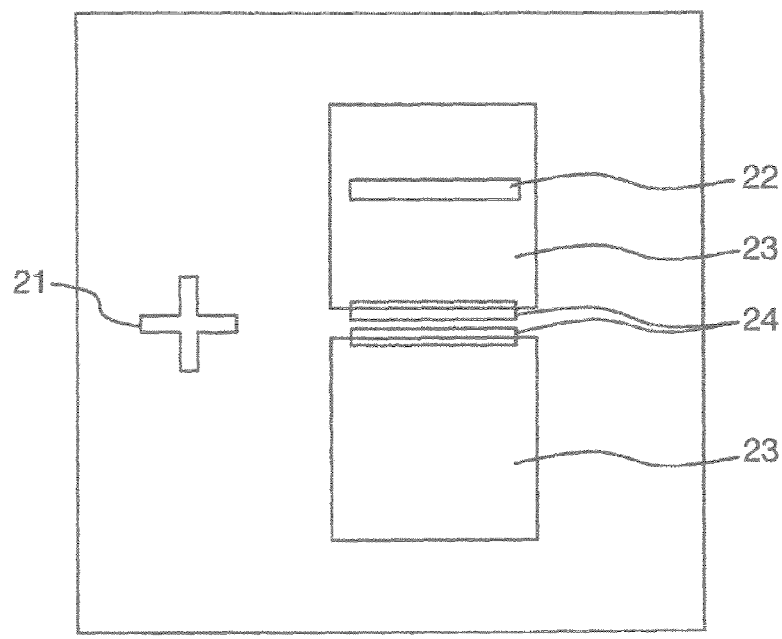
FIG. 6 is an outline of a focused ion beam processing pattern for extracting a very small specimen from an analysis specimen.

This embodiment rotates deflection direction for multiple analysis specimens having relative angular differences to register processing patterns and a cross-shaped position correction mark image used for position correction in the specimen extraction process, as with the second embodiment. FIG. 6 shows the processing pattern of the focused ion beam for extracting a very small specimen from an analysis specimen. The processing pattern for extracting a very small specimen is configured by combining multiple processing patterns. Two rectangular patterns 23 and 24 before and after an extraction portion catch the extraction portion for processing it into a wall-like shape. By using a separation processing pattern 22 for focused-ion-beam processing with a specimen tilted, the base of the wall-like extraction portion is separated from the substrate so as to make it easier for the probe to extract it. The separation processing pattern 22 is a flat rectangle in FIG. 6, but it may have the shape of an inverted U shape to separate the both ends of the wall quickly. The position of the processing pattern is defined by the position on the cross section as with the cross-section observation pattern described above.

Because the apparatus does not have the function to change the deflection pattern to a parallelogram, a distortion-free image cannot be obtained directly from a tilted specimen as with the first embodiment. However, the deflection pattern rotation function, top-down direction scan pitch change function, and image processing may be combined to automatically recognize the position correction mark that is tilted at the separation processing time.

Figure 7:
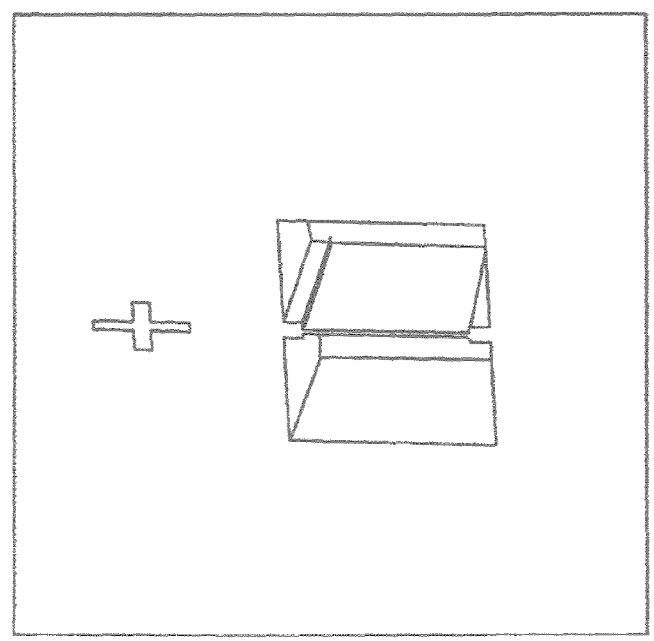
FIG. 7 shows a scan image produced by the focused ion beam at the separation processing time.
Figure 8:
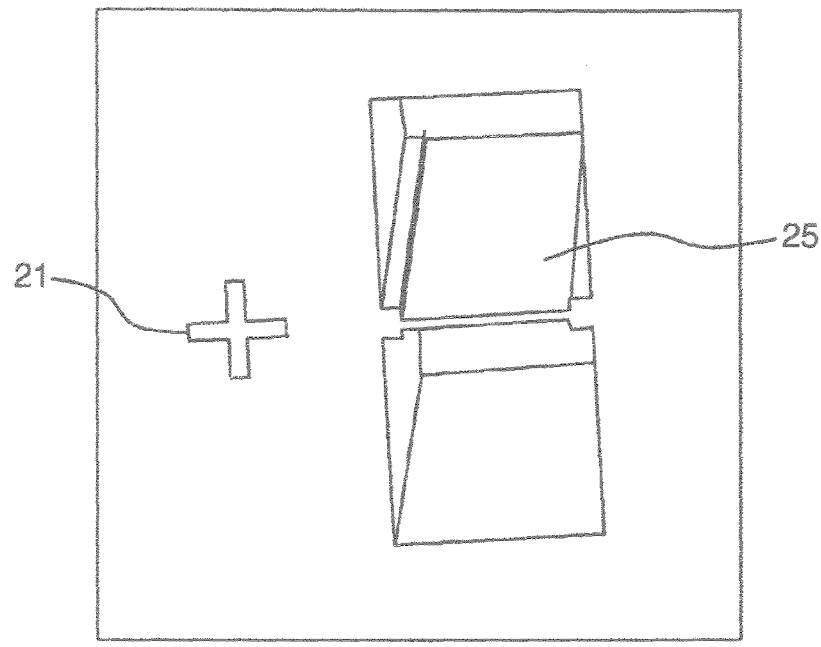
FIG. 8 shows a scan image produced by the focused ion beam obtained by releasing the deflection rotation and reducing the scan pitch in the top-down direction.
Figure 9:
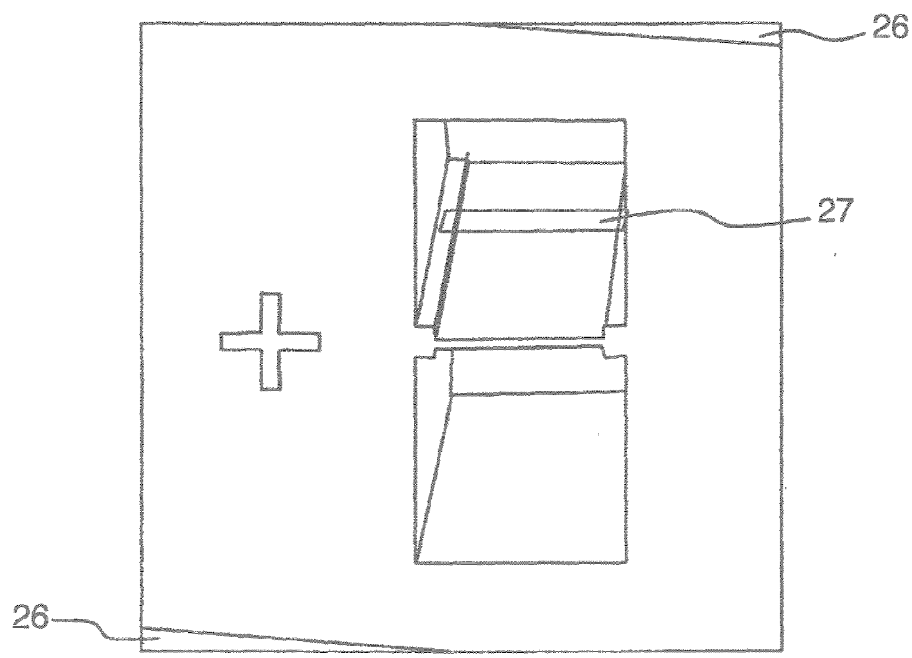
FIG. 9 shows an image produced by rotating the image in FIG. 8 by the rotation processing.

FIG. 7 shows the image after the specimen is tilted, and, in this image, a position correction mark 21 cannot be recognized. However, the image (FIG. 8) expanded in the tilt direction is obtained by multiplying the vertical-direction scan pitch for capturing the vertical-direction image by the cosine of the tilt angle T, cos T (0.707 times in this case because the tilt angle is 45°) in the state where the rotation in the deflection direction at the mark-image registration time is canceled and the top-down direction of the image is adjusted to the tilt direction of the specimen. After that, the image processing is performed for the captured image to rotate it in the same direction in which the image was rotated at the deflection time. This operation can produce a distortion-free image expanded in the same direction and at the same scaling factor as shown in FIG. 9 to automatically recognize the registered position correction mark 21. Because the separation processing pattern is registered on the planar image in FIG. 6 for convenience sake, but is defined actually on the cross section, the relative position vector to the representative point for the position correction mark and the vector from the representative point to each vertex are transformed according to Expression 5. As a result, the separation processing pattern has the shape of a parallelogram as indicated by the reference numeral 27 in the image (FIG. 9) generated by rotating the image in FIG. 8 through the rotation processing. The apparatus performs the inverse-rotation transformation as the actual deflection control of the focused ion beam in the state shown in FIG. 8. In this case, though the beam deflection at the processing time is not parallel to the side of the parallelogram, no problem is generated because the processing for the purpose of specimen separation may be performed in any finished shape.

Even if an apparatus cannot change the deflection pattern completely as with this embodiment, the registered mark position can be automatically recognized by performing the image processing at the same time. However, note that, because the rotation processing through the image processing generates a blank at the end of the image as indicated by the reference numeral 26 in FIG. 9, the position correction mark cannot sometimes be detected if it comes near the end of the image. In this case, the position correction mark can be detected by decreasing the scale factor of the processing pattern definition image, or by capturing the image in a larger range.

Fourth Embodiment

In this embodiment, an FIB processing position is determined based on an SEM image or an FIB processing surface is observed via SEM. The following describes this embodiment with emphasis on the differences from the first to third embodiments.

Figure 10:
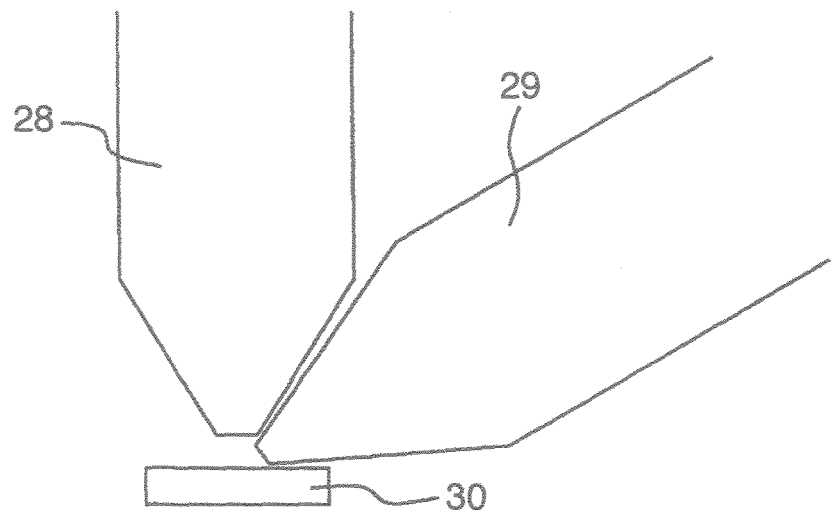
FIG. 10 is a general cross section near the specimen stage.

FIG. 10 is a general cross section diagram showing the neighborhood of the specimen stage and shows the arrangement relation among the focused ion beam column, electron beam column, and specimen stage. In this apparatus, a vertical focused ion beam column 28 and an electron beam column 29 tilted at an angle of 60° are fixed in the specimen chamber. Because there is an angular difference between the specimen image viewed from the focused ion beam column and the specimen image viewed from the electron beam column, the relation between the SIM image and the SEM image is not a simple compression or expansion but a distortion is generated, unless their deflection directions are parallel. This embodiment shows the process in which the position correction mark is detected through observation by the SEM image and then the focused ion beam processing is performed.

Figure 11:
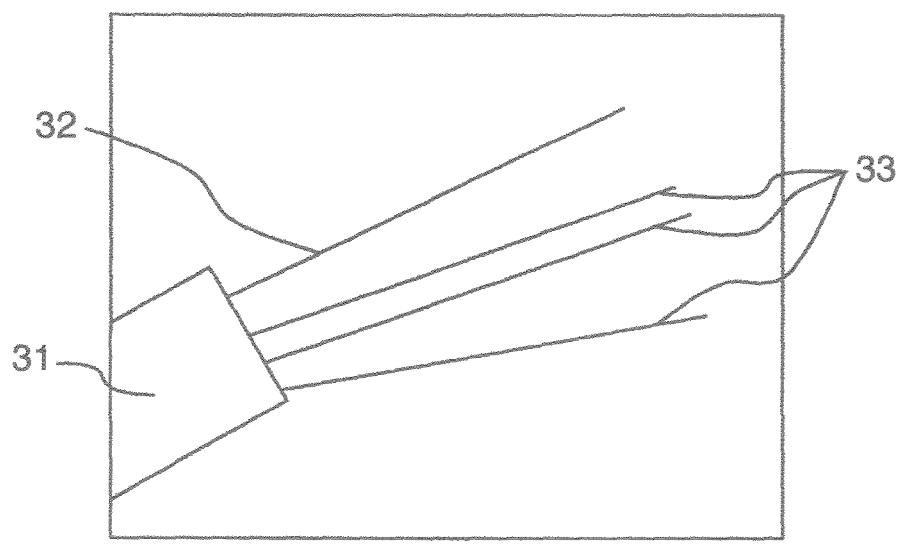
FIG. 11 shows the SEM image of carbon nanotubes at the tip of the metallic needle.

The specimen used in this embodiment is a carbon nanotube which may be damaged when a focused ion beam is irradiated, and is fixed at the tip of a metallic needle 31 as shown in FIG. 11. Unnecessary carbon nanotubes 33 must be cut by the focused ion beam.

Because the SIM image of the specimen for determining the processing position cannot be acquired directly, the focused ion beam processing pattern must be arranged based on the SEM image. By the mechanical position adjustment based on the SEM image, it can be assured that the specimen is near the intersection between the optical axis of the focused ion beam and the optical axis of the electron beam and that the viewing fields of both optical systems overlap. However, because a 10 nm-level specimen processing accuracy is required for the specimen, sufficient processing accuracy cannot be attained simply by transforming the SEM image in FIG. 11 according to the angular difference between observation angles of both optical systems.

Figure 12:
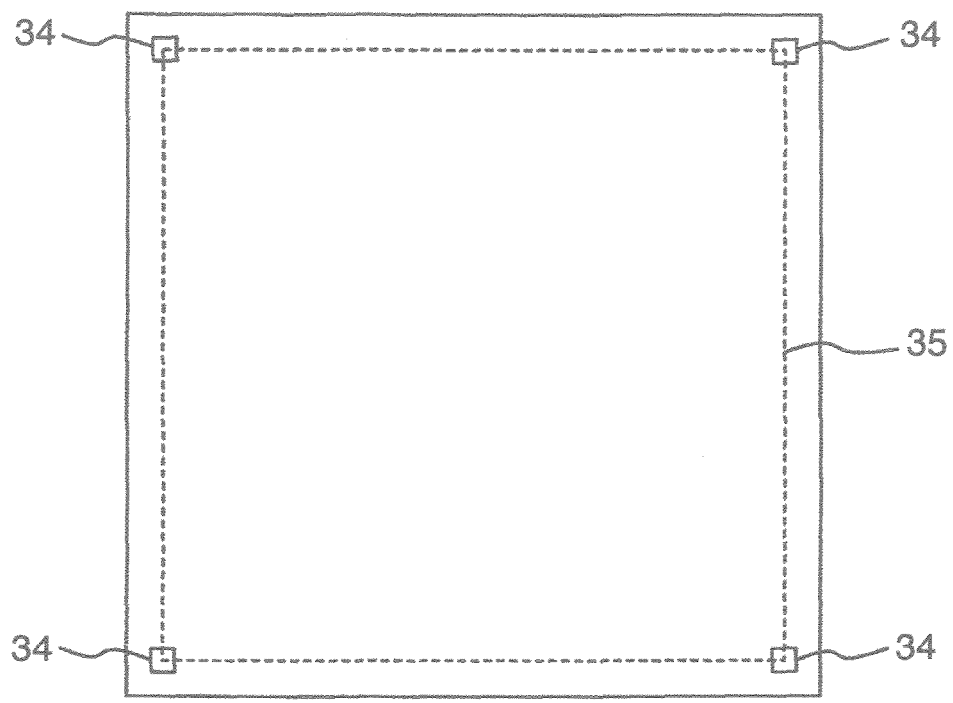
FIG. 12 shows an alignment-processing pattern arranged in the corners of a focused ion beam scan area.
Figure 13:
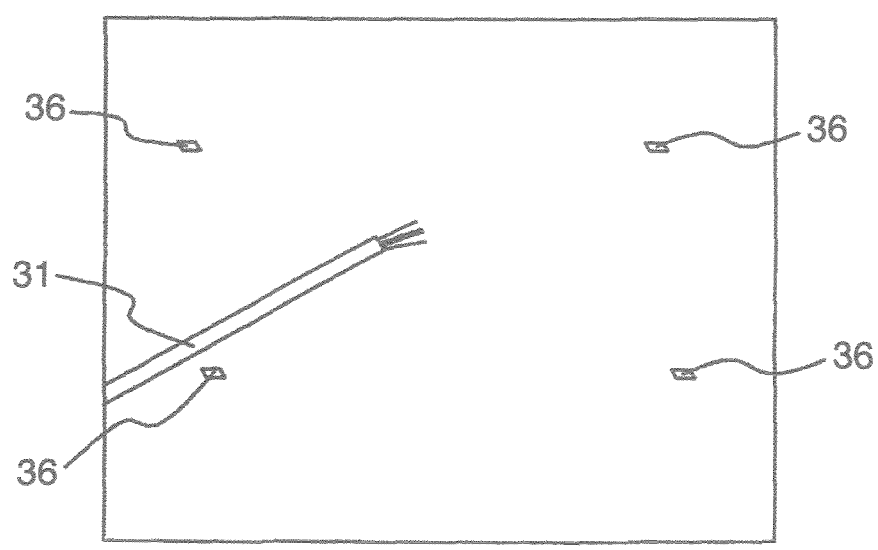
FIG. 13 shows an SEM image produced by observing processed holes by the focused ion beam.
Figure 14:
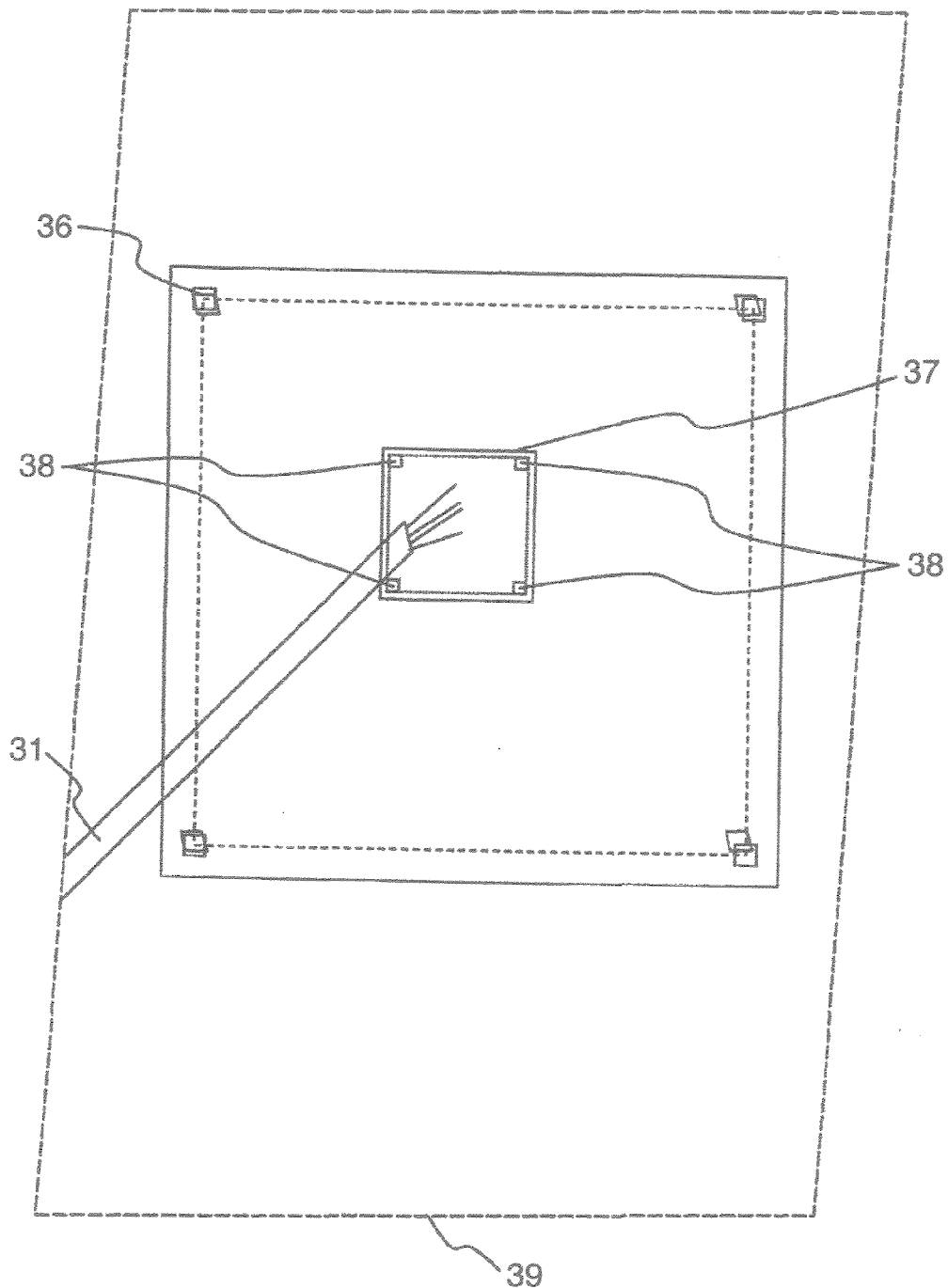
FIG. 14 shows the process in which an SEM image is superposed on an FIB processing pattern.

In this embodiment, four position correction patterns 34 are arranged at the ends of the 5000-fold focused-ion-beam scan range as shown in FIG. 12, and the focused ion beam processing is performed. By detecting the processed patterns as a 3000-fold SEM image (FIG. 12), the image positions are calibrated. The SEM image in FIG. 13 indicates that each of the four patterns forming a square in the focused-ion-beam scan range is distorted into a parallelogram and that the deflection directions of the SEM image and the FIB image are not parallel. This distortion must be corrected and the deflection pattern must be corrected so that the four patterns become congruent squares. However, the difference in the specimen height leads to a parallel displacement (Xo, Yo) between the SEM image and the FIB image. In addition, there is a scale-factor calibration error m and a deflection direction error. Therefore, those four variables must be calculated from the four pixel coordinates on the SEM image and the FIB image using the least square method. Here, it is assumed that the angle T between the columns is exactly the designed value and is correct. FIG. 14 shows the image created by superposing the SEM image in FIG. 13 onto the focused ion beam deflection screen based on the parameter values calculated as described above.

Figure 15:
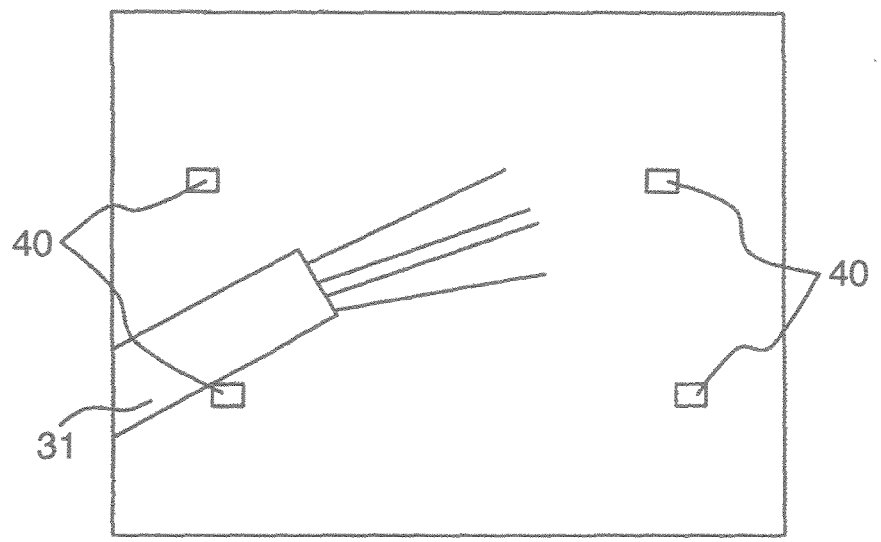
FIG. 15 shows an SEM image produced by observing an alignment processing pattern at a higher scale factor.
Figure 16:
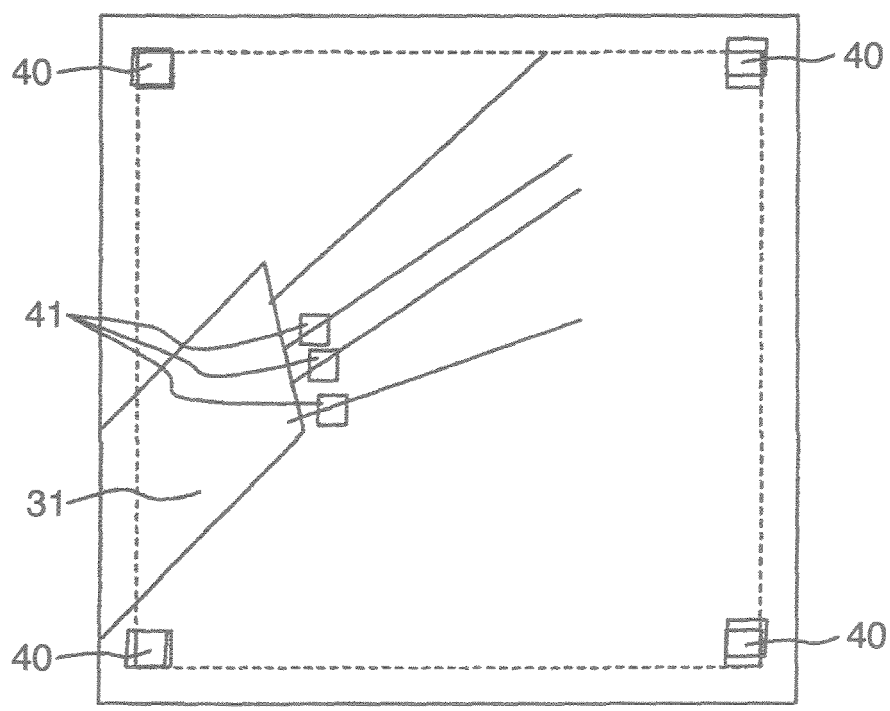
FIG. 16 shows the display screen on which an SEM image is superposed and a carbon nanotube cutting pattern of FIB is arranged.
Figure 17:
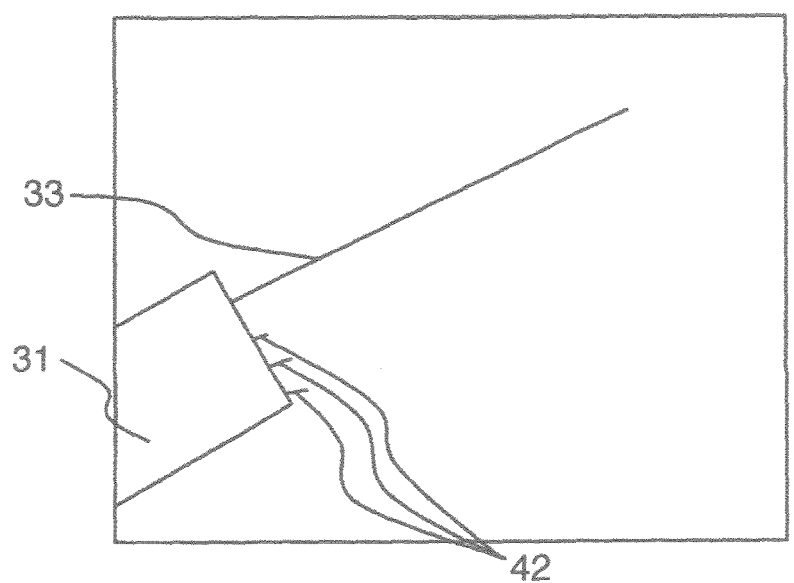
FIG. 17 shows a carbon nanotube SEM image at the tip of the metallic needle after cutting.

This scale factor is too low to arrange the processed patterns. Therefore, in a 30000-fold deflection range 37 that is a newly-specified, high scale-factor FIB processing definition range generated by further zooming the focused ion beam deflection screen, position correction patterns 38 are arranged again, and the focused ion beam processing is performed. FIG. 15 shows the SEM image in the deflection range 37 in FIG. 14, and the reference numeral 40 indicates processed holes formed by the position correction pattern 38. FIG. 16 shows the image generated by superposing this SEM image onto the high-scale-factor focused-ion-beam deflection range 37 that is newly specified. The scale factor is so high that a processed pattern 41 can be arranged in this range. FIG. 16 shows the processed SEM image.

If, in an apparatus according to this embodiment comprising multiple beam optical systems with the relative angle difference of T, the deflection direction of one charged particle beam optical system is adjusted so that the deflection direction becomes vertical to the plane created by the two optical system axes, then the transformation relation of rotating the deflection direction by R can be established with an image observed from another optical system. The apparatus combining heterogeneous charged particle beam optical systems such as FIB-SEM can determine an FIB processing position based on an SEM image and observe the FIB processing surface by the SEM.

Although the focused ion beam column is arranged vertically and the electron beam column is arranged obliquely in this embodiment, the arrangement is not limited to this. Alternatively, the focused ion beam column may be arranged obliquely and the electron beam column may be arranged vertically. In addition, both the focused ion beam column and the electron beam column may also be arranged obliquely. A triple-column configuration is also possible which comprises a Ga focused ion beam column, an Ar focused ion beam column, and an electron beam column.

INDUSTRIAL APPLICABILITY

The present invention allows a charged particle beam apparatus to perform automatic observation and automatic processing, thus increasing the observation or processing work efficiency and the yield rate.

| REFERENCE SIGNS LIST | |
|---|---|
| 1 | Tilt direction |
| 2 | Specific position |
| 3 | Line indicating scan direction |
| 4 | Position correction mark |
| 5 | Observation range |
| 6 | Arrow indicating scan direction |
| 7 | Transformed image acquisition range |
| 8 | Shape of transformed observation range 5 |
| 9 | Analysis specimen |
| 10 | Broken line indicating cross section to be observed |
| 11 | Contact hole for wiring |
| 12, 13 | Processing pattern |
| 14 | Cross-section observation pattern |
| 15 | Cross section to be observed |
| 16 | FIB scan image obtained by transforming scan pattern |
| 17 | Cross-section observation range 14 on tilted image |
| 18 | Specimen surface portion |
| 19 | Cross section of contact hole portion |
| 20 | Relative position vector |
| 21 | Position correction mark |
| 22 | Separation processing pattern for separating the base of extracted specimen |
| 23 | Rectangular pattern for processing extracted specimen into wall-like shape |
| 24 | Rectangular pattern for making wall-like extracted specimen thinner |
| 25 | Extracted specimen portion |
| 26 | Separation processing pattern arranged based on automatic recognition of position correction mark |
| 27 | Blank portion on image generated by image rotation processing |
| 28, 101 | Focused ion beam column |
| 29, 102 | Electron beam column |
| 30 | Specimen stage of FIB-SEM device |
| 31 | Metallic needle for supporting carbon nanotube |
| 32 | Carbon nanotube directed in the direction of needle |
| 33 | Carbon nanotube not directed in the direction of needle |
| 34 | Alignment pattern on FIB processing/editing screen |
| 35 | Auxiliary pattern for specifying the positional relation of alignment pattern |
| 36 | FIB processed hole observed on SEM image |
| 37 | Deflection range |
| 38 | Position correction pattern |

-continued

| REFERENCE SIGNS LIST | |
|---|---|
| 39 | Outer circumference of SEM image distorted for aligning FIB processed hole with processing pattern |
| 40 | FIB processed hole observed on high scale-factor SEM image |
| 41 | Carbon nanotube cutting pattern arranged on editing screen where high-scale-factor SEM image is superposed |
| 42 | Carbon nanotubes that are cut |
| 100 | Charged particle beam apparatus |
| 103 | Vacuum specimen chamber |
| 104 | Specimen stage |
| 105 | Probe |
| 106 | Probe driving unit |
| 108 | Detector |
| 109 | Display |
| 110 | Arithmetic processing unit |
| 111 | Specimen |
| 112 | Nozzle tip |
| 115 | Deposit gas source |
| 121 | Ion beam control unit |
| 122 | Electron beam control unit |
| 123 | Detector control unit |
| 124 | Stage control unit |
| 125 | Deposit gas source control unit |
| 126 | Probe control unit |

The invention claimed is:

1. A charged particle beam apparatus comprising:
a deflector that deflects and scans a charged particle beam;
a specimen stage that can be tilted with a specimen being mounted on it;
a display unit that displays an image generated from detected signals of secondary particles generated from the specimen by irradiating the charged particle beam; and
an arithmetic unit that controls a deflection pattern of the charged particle beam, wherein the arithmetic unit can change the deflection pattern of the charged particle beam from a rectangle to a parallelogram.

2. The charged particle beam apparatus according to claim 1 wherein
a scan direction of the charged particle beam is parallel to a side of the parallelogram.

3. The charged particle beam apparatus according to claim 1 wherein
a shape of the parallelogram is changed according to a specimen-stage deflection rotation angle to an observation direction of the charged particle beam and a specimen-stage tilt angle.

4. The charged particle beam apparatus according to claim 1 wherein
according to an angle between a first observation direction of the charged particle beam for the not-tilted specimen stage and a second observation direction of the charged particle beam for the tilted specimen stage and an angle between a perpendicular to a plane formed by the first and the second observation directions and a deflection-and-scan direction of the charged particle beam,
a deflection pattern of the charged particle beam in a case where observation is made from the first observation direction is transformed to a deflection pattern of the charged particle beam in a case where observation is made from the second observation direction.

5. The charged particle beam apparatus according to claim 1, wherein:
an image of a position correction mark on the specimen acquired by scanning the charged particle beam in a rectangle from a first observation direction for the not-tilted specimen stage, is registered in the arithmetic unit, and the arithmetic unit detects the position correction mark from an image acquired by scanning the charged particle beam in a parallelogram from a second observation direction for the tilted specimen stage.

6. The charged particle beam apparatus according to claim 1 wherein the display unit superposes and displays an image of a position correction mark on the specimen acquired by scanning the charged particle beam in a rectangle from a first observation direction for the not-tilted specimen stage, and an image acquired by scanning the charged particle beam in a parallelogram from a second observation direction for the tilted specimen stage.

7. The charged particle beam apparatus according to claim 1 wherein the charged particle beam is an ion beam.

8. The charged particle beam apparatus according to claim 1 wherein the charged particle beam is an electron beam.

9. The charged particle beam apparatus according to claim 1 comprising:

an ion beam column that irradiates an ion beam; and an electron beam column that irradiates an electron beam.

10. The charged particle beam apparatus according to claim 1 wherein the arithmetic unit can register a processing pattern for extracting a very small specimen from the specimen mounted on the specimen stage.

11. A charged particle beam apparatus, comprising:

a first deflector that deflects and scans a first charged particle beam;

a second deflector that deflects and scans a second charged particle beam;

a specimen stage that can be tilted with a specimen being mounted on it at an intersection between an optical axis of the first charged particle beam and an optical axis of the second charged particle beam;

a display unit that displays an image generated from detected signals of secondary particles generated from the specimen by irradiating the first charged particle beam and the second charged particle beam; and an arithmetic unit that controls deflection patterns of the first charged particle beam and the second charged particle beam wherein the arithmetic unit makes the deflection pattern of the first charged particle beam to be a rectangular and the deflection pattern of the second charged particle beam to be a parallelogram.

12. The charged particle beam apparatus according to claim 11, wherein according to an angle between a first observation direction relating to the optical axis of the first charged particle beam and a second observation direction relating to the optical axis of the second charged particle beam and an angle between a perpendicular to a plane formed by the first and the second observation directions and deflection-and-scan directions of the first and second charged particle beam, and a deflection pattern of the first charged particle beam in a case where observation is made from the first observation direction is transformed to a deflection pattern of the second charged particle beam in a case where observation is made from the second observation direction.

13. The charged particle beam apparatus according to claim 11, wherein the display unit superposes and displays an image of a position correction mark on the specimen acquired by scanning the first charged particle beam in a rectangle from the first observation direction relating to the axis of the first charged particle beam, and an image acquired by scanning the second charged particle beam in a parallelogram from the second observation direction relating to the axis of the second charged particle beam.

14. The charged particle beam apparatus according to claim 11, wherein the first charged particle beam is an ion beam.

15. The charged particle beam apparatus according to claim 11, wherein the second charged particle beam is an electron beam.

16. The charged particle beam apparatus according to claim 11, further comprising:

an ion beam column that irradiates an ion beam; and an electron beam column that irradiates an electron beam.

17. The charged particle beam apparatus according to claim 11, wherein the arithmetic unit can register a processing pattern for extracting a very small specimen from the specimen mounted on the specimen stage.

\* \* \* \* \*